United States Patent
Glenn et al.

(10) Patent No.: US 6,580,153 B1
(45) Date of Patent: Jun. 17, 2003

(54) STRUCTURE FOR PROTECTING A MICROMACHINE WITH A CAVITY IN A UV TAPE

(75) Inventors: Thomas P. Glenn, Gilbert, AZ (US); Roy Dale Hollaway, Chandler, AZ (US); Steven Webster, Chandler, AZ (US)

(73) Assignee: Amkor Technology, Inc., Chandler, AK (US)

( * ) Notice: Subject to any disclaimer, the term of this patent is extended or adjusted under 35 U.S.C. 154(b) by 0 days.

(21) Appl. No.: 09/811,183

(22) Filed: Mar. 14, 2001

(51) Int. Cl.[7] .............................................. H01L 21/304
(52) U.S. Cl. ......................... 257/620; 257/623; 257/626
(58) Field of Search ................................... 257/620, 626, 257/632, 638, 642, 643; 438/106–107, 110, 113, 458, 460, 464, 975

(56) References Cited

U.S. PATENT DOCUMENTS

| | | | |
|---|---|---|---|
| 5,362,681 A | * 11/1994 | Roberts, Jr. et al. | 438/464 |
| 5,527,744 A | 6/1996 | Mignardi et al. | 437/226 |
| 5,832,585 A | 11/1998 | Takiar et al. | 29/424 |
| 6,235,141 B1 | 5/2001 | Feldman et al. | 156/250 |
| 6,245,593 B1 | * 6/2001 | Yoshihara et al. | 438/106 |
| 2001/0019765 A1 | 9/2001 | Kinchi et al. | 428/345 |

FOREIGN PATENT DOCUMENTS

| | | | |
|---|---|---|---|
| CA | 2119505 A | * | 3/1995 |
| JP | 63-43342 A | | 2/1988 |
| JP | 63-43988 A | | 2/1988 |

OTHER PUBLICATIONS

Encyclopedia of Polymer Science and Engineering, vol. 6, p. 112.*

Lucey, Michael F., "UV Curable Coatings for Electronic Components", IEEE Transactions on Components, Packaging and Manufacturing Technology–Part A vol. 17 No. 3, Sep. 1994, pp. 326–332.

WEB page Article, Nitto Denko America, Inc., "Answering the Sophisticated Demands of the Semiconductor Manufacturing Process," copyright 1995–1999, 1 page.

* cited by examiner

Primary Examiner—John F. Niebling
Assistant Examiner—Thomas L. Dickey
(74) Attorney, Agent, or Firm—Gunnison, McKay & Hodgson, L.L.P.; Serge J. Hodgson

(57) ABSTRACT

A protective layer includes a polymerized region, which forms a cavity in an interior surface of the protective layer. The protective layer is mounted to a micromachine chip such that an active area of the micromachine chip is located within the cavity of the protective layer. The protective layer protects the active area during front-side or back-side singulation of the micromachine chip from a micromachine substrate.

21 Claims, 5 Drawing Sheets

STRUCTURE FOR PROTECTING A MICROMACHINE WITH A CAVITY IN A UV TAPE

BACKGROUND OF THE INVENTION

1. Field of the Invention

The present invention relates generally to wafer singulation. More particularly, the present invention relates to a structure for protection of electronic components during wafer singulation.

2. Description of the Related Art

A number of electronic components chips (hereinafter "chips") are batch processed as an array on a wafer. The wafer is then cut to singulate the wafer and to separate the chips.

For certain applications, the front-side surface of a chip, e.g., a micromachine chip, has formed on it an active area. Illustratively, the active area includes various types of special-purpose devices, such as, for example, micromachines. It is important that the active area not be contacted and contaminated with silicon shards, particulates, or water from the singulation process. Otherwise, the active area is damaged or destroyed. Consequently, the active area must be protected from undesired contamination or contact during the wafer singulation process.

One prior art technique disclosed in Roberts Jr., et al., U.S. Pat. No. 5,362,681, which is herein incorporated by reference in its entirety, uses two separate layers of tape for protecting the active area of a chip during wafer singulation.

Initially, precisely positioned, spaced-apart holes are mechanically punched into the first layer of tape. The punched holes in the first layer are precisely aligned over the active areas on the front-side surface of the wafer and the first layer is attached to the front-side surface of the wafer.

The second layer of tape is then attached to the first layer sealing the punched holes and forming cavities over the active areas. In this manner, the two layers of tape protect the active areas. The wafer is then singulated from the back-side surface of the wafer.

It should be readily apparent that mechanically punching the holes in the first layer, precisely aligning the holes over the active areas on the front-side surface of the wafer, attaching the first layer to the front-side surface of the wafer, and attaching the second layer to the first layer to seal the holes is relatively expensive and complex. Consequently, a need exists for a simple, economical technique for protecting active areas on the front-side surface of a wafer from contaminants during singulation of the wafer.

SUMMARY OF THE INVENTION

In accordance with the present invention, a protective layer includes a polymerized region, which forms a cavity in an interior surface of the protective layer. The protective layer is mounted to a micromachine chip such that an active area of the micromachine chip is located within the cavity of the protective layer. The protective layer protects the active area during front-side or back-side singulation of the micromachine chip from a micromachine substrate.

Advantageously, the prior art requirement of mechanically punching holes in a first layer, precisely aligning the holes over active areas on a front-side surface of a wafer, attaching the first layer to the front-side surface of the wafer, and attaching a second layer to the first layer to seal the holes is eliminated. Accordingly, processing of micromachine chips in accordance with the present invention is less complex, less labor intensive and thus less expensive than fabrication of micromachine chips in the prior art.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, a protective layer 200 (FIG. 3) includes a polymerized region 206A, which forms a cavity 210A in an interior surface 100I of protective layer 200. Protective layer 200 is mounted to a micromachine chip 312A such that an active area 314A of micromachine chip 312A is located within cavity 210A of protective layer 200. Protective layer 200 protects active area 314A during front-side (FIG. 4) or back-side (FIG. 7) singulation of micromachine chip 312A from a micromachine substrate 302.

Figure 1A:
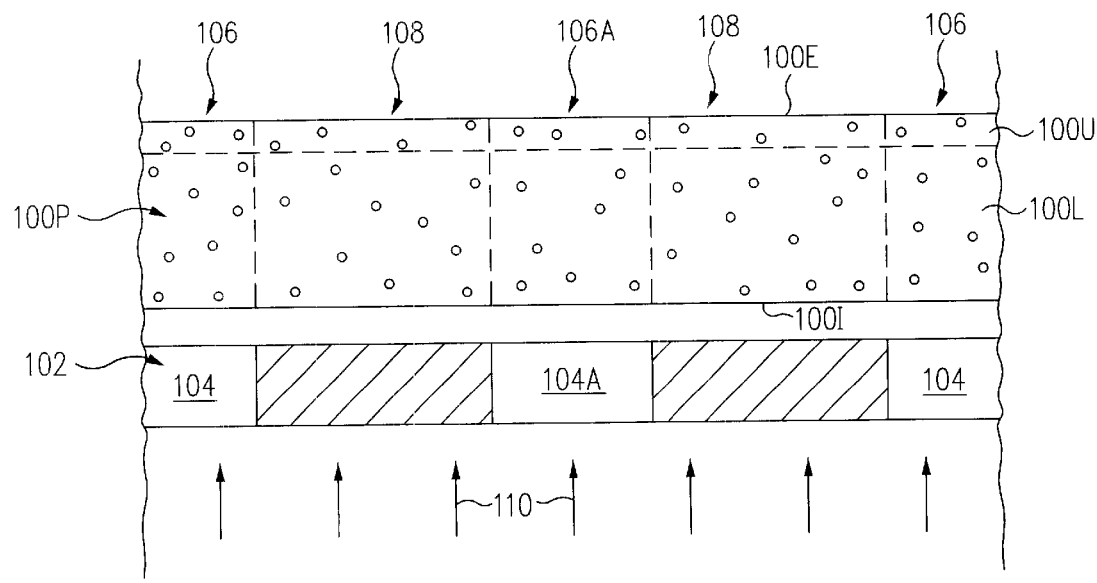
FIG. 1A is a cross-sectional view of a positive characteristic polymerizable layer in accordance with one embodiment of the present invention.

More particularly, FIG. 1A is a cross-sectional view of a positive characteristic polymerizable layer 100P in accordance with one embodiment of the present invention. Positive characteristic polymerizable layer 100P is formed of a positive characteristic polymerizable material. Generally, positive characteristic polymerizable materials polymerize and shrink upon being exposed to energy, e.g., radiation such as ultraviolet radiation, or heat. A positive ultraviolet-sensitive material polymerizes and shrinks upon being exposed to ultraviolet radiation and is one example of a positive characteristic polymerizable material.

In one embodiment, positive characteristic polymerizable layer 100P is a positive ultraviolet-sensitive material. For simplicity of discussion, various polymerizations of positive characteristic polymerizable layer 100P with ultraviolet radiation are set forth below. However, in light of this disclosure, it is understood that positive characteristic polymerizable layer 100P is formed of other positive characteristic polymerizable materials and that other energies besides ultraviolet radiation are used in other embodiments.

Referring now to FIG. 1A, positive characteristic polymerizable layer 100P includes an interior, e.g., first, surface 100I and an exterior, e.g., second, surface 100E. In one embodiment, positive characteristic polymerizable layer 100P includes a lower, e.g., first, layer 100L adjacent interior surface 100I and an upper, e.g., second, layer 100U adjacent exterior surface 100E.

For example, positive characteristic polymerizable layer 100P is a single integral layer of positive ultraviolet-sensitive material, which has been irradiated with ultraviolet radiation from exterior surface 100E to selectively polymerize upper layer 100U yet leave lower layer 100L unpolymerized. In another embodiment, upper layer 100U is tape, e.g., MYLAR, and lower layer 100L is a positive ultraviolet sensitive material. For simplicity of discussion, positive characteristic polymerizable layer 100P is discussed and illustrated as being a single layer, i.e., not having upper layer 100U and lower layer 100L, although it is understood that positive characteristic polymerizable layer 100P would have upper layer 100U and lower layer 100L depending upon the particular application.

A positive mask 102 is placed adjacent interior surface 100I. Positive mask 102 includes a plurality of windows 104 including a first window 104A. In one embodiment, windows 104 are apertures in positive mask 102 although other windows are used in other embodiments. Positive mask 102 is opaque to ultraviolet radiation, e.g., positive mask 102 is a stainless-steel plate, although positive mask 102 is formed of other materials in other embodiments.

Exposed regions 106 of positive characteristic polymerizable layer 100P are exposed through windows 104. To illustrate, a first exposed region 106A of the plurality of exposed regions 106 is exposed through window 104A. Conversely, protected regions 108 of positive characteristic polymerizable layer 100P are masked, sometimes called shielded, by positive mask 102. Although protected regions 108 are illustrated as being separate regions in the cross-sectional views of the figures, it is understood that protected regions 108 are all part of a single protected region.

Ultraviolet radiation 110 is directed at positive mask 102. Ultraviolet radiation 110 passes through windows 104 and into exposed regions 106. Positive mask 102 prevents ultraviolet radiation 110 from entering into protected regions 108. Those of skill in the art will recognize that the exposure intensity and times used in the various processes described herein will vary from application to application according to the particular polymerizable material used and the specific results desired.

Selective irradiation of positive characteristic polymerizable layer 100P with ultraviolet radiation 110 results in the formation of a positive characteristic protective layer 200P as discussed in greater detail below with reference to FIG. 2A.

Figure 2A:
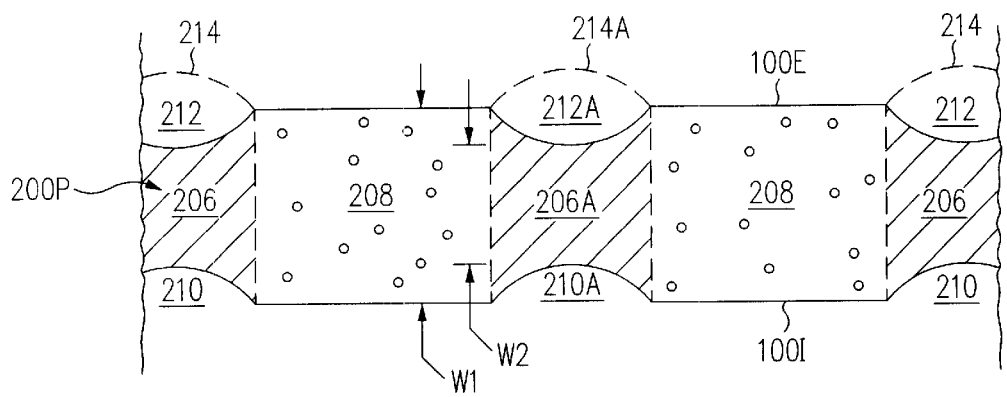
FIG. 2A is a cross-sectional view of a positive characteristic protective layer in accordance with one embodiment of the present invention.

FIG. 2A is a cross-sectional view of positive characteristic protective layer 200P in accordance with one embodiment of the present invention. Referring now to FIGS. 1A and 2A together, exposed regions 106 are polymerized by ultraviolet radiation 110 to form polymerized regions 206. Further, protected regions 108 remain unpolymerized and form unpolymerized regions 208.

Referring now to FIG. 2A, polymerized regions 206 have shrunk in volume relative to unpolymerized regions 208 such that unpolymerized regions 208 have a greater width W1 than a width W2 of polymerized regions 206. As a result, cavities 210 are formed in interior surface 100I of positive characteristic protective layer 200P. In one embodiment, cavities 210 are concave but have other shapes in other embodiments.

To illustrate, a first cavity 210A of the plurality of cavities 210 is formed by, and adjacent to, a first polymerized region 206A of the plurality of polymerized regions 206. The other cavities 210 are formed by, and adjacent to, the other polymerized regions 206 in a similar manner so are not discussed further to avoid detracting from the principals of the invention.

For similar reasons, cavities 212 are formed in exterior surface 100E of positive characteristic protective layer 200P. To illustrate, a first cavity 212A of the plurality of cavities 212 is formed by, and adjacent to, polymerized region 206A. The other cavities 212 are formed by, and adjacent to, the other polymerized regions 206 in a similar manner so are not discussed further to avoid detracting from the principals of the invention.

In an alternative embodiment, instead of the formation of cavities 212, polymerized regions 206 pucker and have protrusions 214 protruding from exterior surface 100E as indicated by the dashed lines. To illustrate, polymerized region 206A includes a first protrusion 214A of the plurality of protrusions 214. The other polymerized regions 206 have protrusions 214 in a similar manner so are not discussed further to avoid detracting from the principals of the invention.

For simplicity, positive characteristic protective layer 200P having cavities 212 is illustrated and discussed below although it is understood that positive characteristic protective layer 200P has protrusions 214 instead cavities 212 depending upon the particular application.

Interior surface 100I, which is now formed by unpolymerized regions 208, is adhesive, sometimes called sticky. Advantageously, this allows interior surface 100I to be used to mount positive characteristic protective layer 200P to a substrate, e.g., wafer, as described further below in reference to FIG. 3. However, upon subsequent irradiation of positive characteristic protective layer 200P and the corresponding polymerization of unpolymerized regions 208, interior surface 100I becomes nonadhesive facilitating removal of positive characteristic protective layer 200P from the substrate as discussed further below in reference to FIGS. 6 and 8.

Figure 1B:
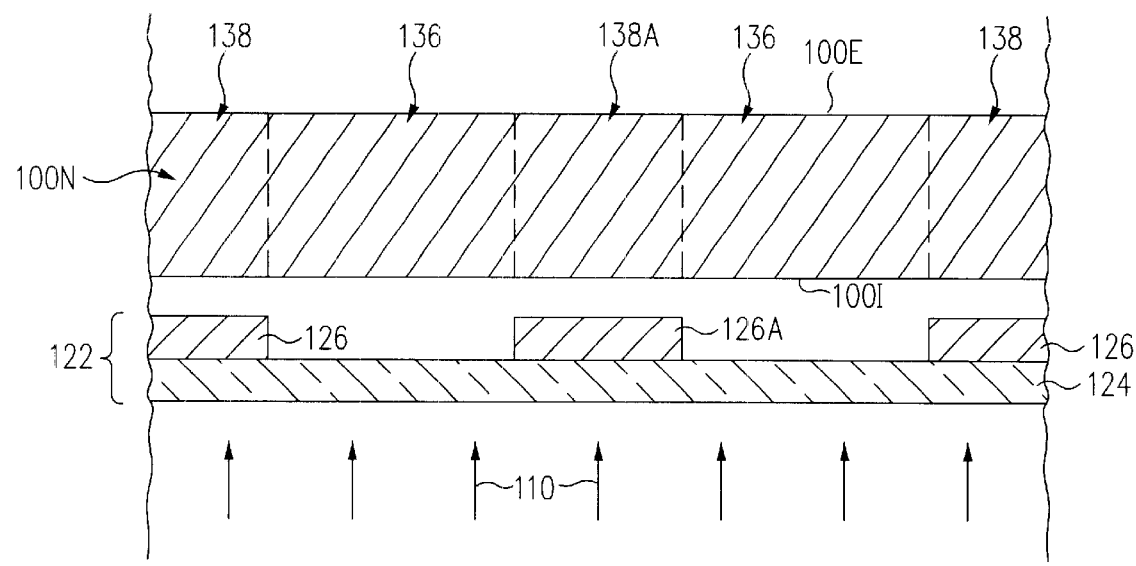
FIG. 1B is a cross-sectional view of a negative characteristic polymerizable layer in accordance with another embodiment of the present invention.

FIG. 1B is a cross-sectional view of a negative characteristic polymerizable layer 100N in accordance with another embodiment of the present invention. Negative characteristic polymerizable layer 100N is formed of a negative characteristic polymerizable material. Generally, negative characteristic polymerizable materials unpolymerize and expand upon being exposed to energy, e.g., radiation such as ultraviolet radiation, or heat. A negative ultraviolet-sensitive material unpolymerizes and expands upon being exposed to ultraviolet radiation and is one example of a negative characteristic polymerizable material.

In one embodiment, negative characteristic polymerizable layer 100N is a negative ultraviolet-sensitive material. For simplicity of discussion, various polymerizations of negative characteristic polymerizable layer 100N with ultraviolet radiation are set forth below. However, in light of this discussion, is understood that negative characteristic polymerizable layer 100N is formed of other negative characteristic polymerizable materials and that other energies besides ultraviolet radiation are used in other embodiments.

Referring now to FIG. 1B, negative characteristic polymerizable layer 100N includes an interior, e.g., first, surface 100I and an exterior, e.g., second, surface 100E.

A negative mask 122 is placed adjacent interior surface 100I. Negative mask 122 includes a transparent support 124, e.g., glass, having a plurality of opaque shields 126, e.g., metal, formed thereon.

Exposed regions 136 of negative characteristic polymerizable layer 100N are exposed through transparent support 124. Conversely, protected regions 138 of negative characteristic polymerizable layer 100N are masked, sometimes called shielded, by opaque shields 126. To illustrate, a first protected region 138A of the plurality of protected regions 138 is masked by a first opaque shield 126A of the plurality of opaque shield 126.

Ultraviolet radiation 110 is directed at negative mask 122. Ultraviolet radiation 110 passes through transparent support 124 and into exposed regions 136. Opaque shields 126 prevent ultraviolet radiation 110 from entering into protected regions 138. Selective irradiation of negative characteristic polymerizable layer 100N with ultraviolet radiation 110 results in the formation of a negative characteristic protective layer 200N as discussed in greater detail below with reference to FIG. 2B.

Figure 2B:
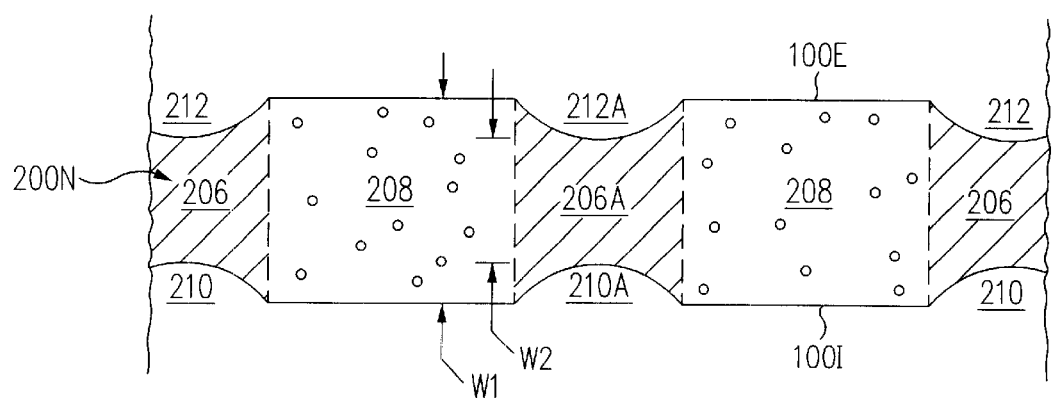
FIG. 2B is a cross-sectional view of negative characteristic protective layer in accordance with an alternative embodiment of the present invention.

FIG. 2B is a cross-sectional view of negative characteristic protective layer 200N in accordance with one embodiment of the present invention. Referring now to FIGS. 1B and 2B together, exposed regions 136 are unpolymerized by ultraviolet radiation 110 to form unpolymerized regions 208. Further, protected regions 138 remain polymerized and form polymerized regions 206.

Referring now to FIG. 2B, unpolymerized regions 208 have expanded in volume relative to polymerized regions 206. As a result, cavities 210, 212 are formed in interior surface 100I, exterior surface 100E, respectively, of negative characteristic protective layer 200N.

Referring now to FIGS. 2A and 2B together, negative characteristic protective layer 200N is substantially similar to positive characteristic protective layer 200P with some exceptions. Upon being irradiated with ultraviolet radiation, polymerized regions 206 of negative characteristic protective layer 200N become unpolymerized. In contrast, upon being irradiated with ultraviolet radiation, unpolymerized regions 208 of positive characteristic protective layer 200P become polymerized and interior surface 100I becomes nonadhesive. In the following discussion and figures, a protective layer 200 is illustrated and discussed. It is understood that protective layer 200 is either positive characteristic protective layer 200P of FIG. 2A or negative characteristic protective layer 200N of FIG. 2B unless otherwise indicated.

Figure 3:
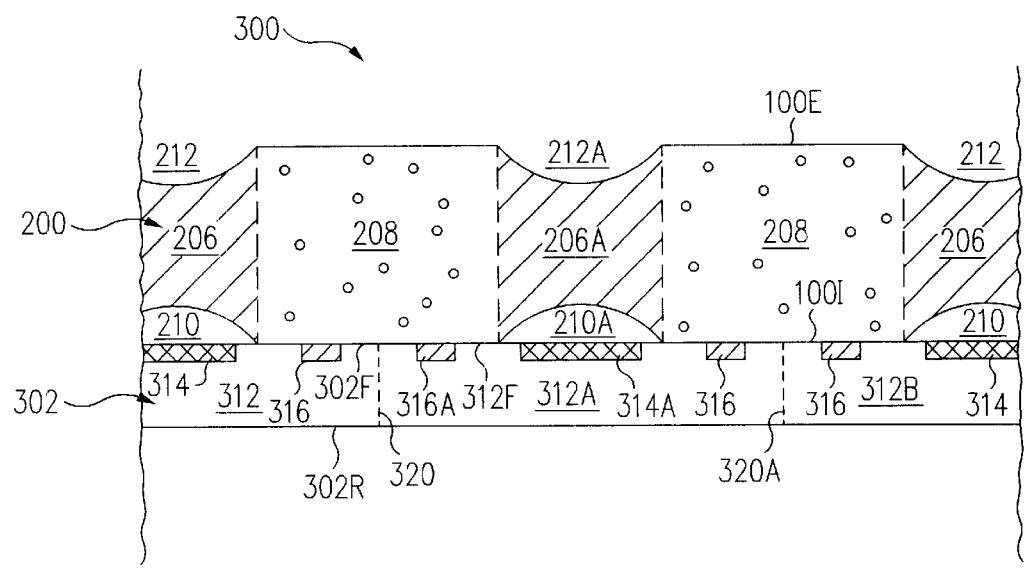
FIG. 3 is a cross-sectional view of a structure during singulation processing in accordance with one embodiment of the present invention.

FIG. 3 is a cross-sectional view of a structure 300 during singulation processing in accordance with one embodiment of the present invention. Structure 300 includes a micromachine substrate 302, e.g., a silicon or gallium arsenide wafer. Micromachine substrate 302 includes a plurality of micromachine chips 312 integrally connected to one another.

Micromachine chips 312 include active areas 314 formed on a front-side, e.g., first, surface. 302F of micromachine substrate 302. Active areas 314 include the miniature moveable micromachines. Micromachine chips 312 further include bond pads 316 on front-side surface 302F of micromachine substrate 302. Bond pads 316 are connected to the internal circuitry of micromachine chips 312.

To illustrate, a first micromachine chip 312A of the plurality of micromachine chips 312 includes a first active area 314A of the plurality of active areas 314. Micromachine chip 312A also includes a first bond pad 316A of the plurality of bond pads 316. The other micromachine chips 312 include active areas 314 and bond pads 316 in a similar manner. Although micromachine chips 312 are set forth, in light of this disclosure, is understood that other electronic components having active areas on a front-side surface are used in other embodiments. For example, chips 312 are image sensor chips, sometimes called optical chips, and active areas 314 are image arrays. As another alternative, micromachine chips 312 are micromirror device chips and active areas 314 contain miniature moveable micromirrors. As yet another embodiment, chips 312 are vertical cavity surface emitting laser (VCSEL) chips.

Micromachine chips 312 are integrally connected together in an array, e.g., a 2×2, 3×3, . . . or n×m array. Each of micromachine chips 312 is delineated by a singulation street 320, which is located between adjacent micromachine chips 312. For example, a first singulation street 320A of the plurality of singulation streets 320 of micromachine substrate 302 delineates first micromachine chip 312A from a second micromachine chip 312B of the plurality of micromachine chips 312. The other micromachine chips 312 are similarly delineated from adjacent micromachine chips 312 by corresponding singulation streets 320.

Protective layer 200 is aligned to micromachine substrate 302. More particularly, polymerized regions 206 are aligned with active areas 314 such that cavities 210 are located above corresponding active areas 314. In one embodiment, polymerized regions 206 have a contrast to unpolymerized regions 208. For example, polymerized regions 206 are darker than unpolymerized regions 208 or vice versa. As another example, polymerized regions 206 have a different color than unpolymerized regions 208. In this manner, cavities 210, and more generally protective layer 200, are aligned directly to active areas 314. In yet another alternative embodiment, protective layer 200 is fabricated with alignment marks, which are used to align protective layer 200 to micromachine substrate 302.

Protective layer 200 is mounted to micromachine substrate 302 such that polymerized regions 206 are above active areas 314 and active areas 314 are located within cavities 210. Accordingly, active areas 314 are sealed within cavities 210 and protected during further singulation processing as described further below.

Advantageously, interior surface 100I is adhesive thus facilitating adhesive mounting of protective layer 200 to micromachine substrate 302. More particularly, interior surface 100I contacts and is adhesively attached to front-side surface 302F of micromachine substrate 302 around a periphery of each active area 314. However, interior surface 100I, and more generally protective layer 200, does not contact active areas 314 thus preventing damage or destruction to active areas 314.

To illustrate, active area 314A is located within cavity 210A. Interior surface 100I does not contact active area 314A. However, interior surface 100I contacts and is adhesively attached to front-side surface 302F of micromachine substrate 302 around a periphery of active area 314A. More particularly, interior surface 100I contacts and is adhesively attached to a front-side surface 312F of micromachine chip 312A around a periphery of active area 314A. The other active areas 314 are located within the other cavities 210 in a similar manner and so are not discussed further to avoid detracting from the principals of the invention.

Figure 4:
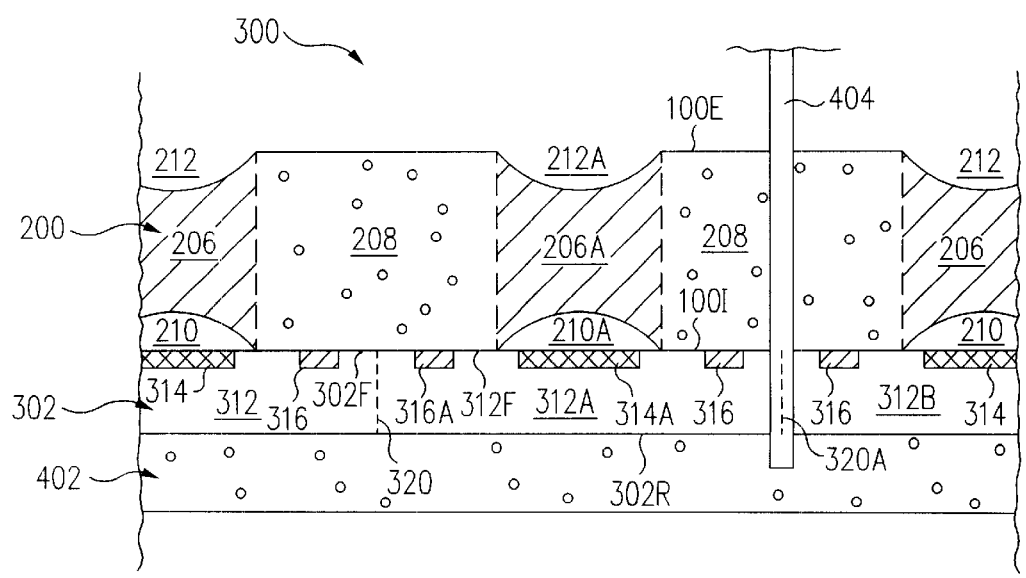
FIG. 4 is a cross-sectional view of the structure of FIG. 3 at a further stage during singulation processing in accordance with one embodiment of the present invention.

FIG. 4 is a cross-sectional view of structure 300 of FIG. 3 at a further stage during singulation processing in accordance with one embodiment of the present invention. As shown in FIG. 4, a back-side, e.g., second, surface 302R of micromachine substrate 302 is attached to a singulation support 402, e.g., a sticky tape commonly used during wafer singulation as is well known to those of skill in the art.

A saw 404, e.g., mechanical saw, laser saw or high-pressure water saw, is aligned to singulation street 320A. Protective layer 200 and micromachine substrate 302 are cut along singulation street 320A. More generally, protective layer 200 and micromachine substrate 302 are cut along singulation streets 320 thus singulating micromachine substrate 302 and separating micromachine chips 312.

In one embodiment, protective layer 200 has a transparency sufficient to allow saw 404 to be optically aligned directly to singulation streets 320. In an alternative embodiment, saw 404 is aligned to singulation streets 320 indirectly using an alignment mark(s), for example, on exterior surface 100E of protective layer 200.

Saw 404 cuts all the way through protective layer 200 and micromachine substrate 302 yet only scores singulation support 402. Accordingly, after singulation of micromachine substrate 302, micromachine chips 312 are supported by singulation support 402.

Figure 5:
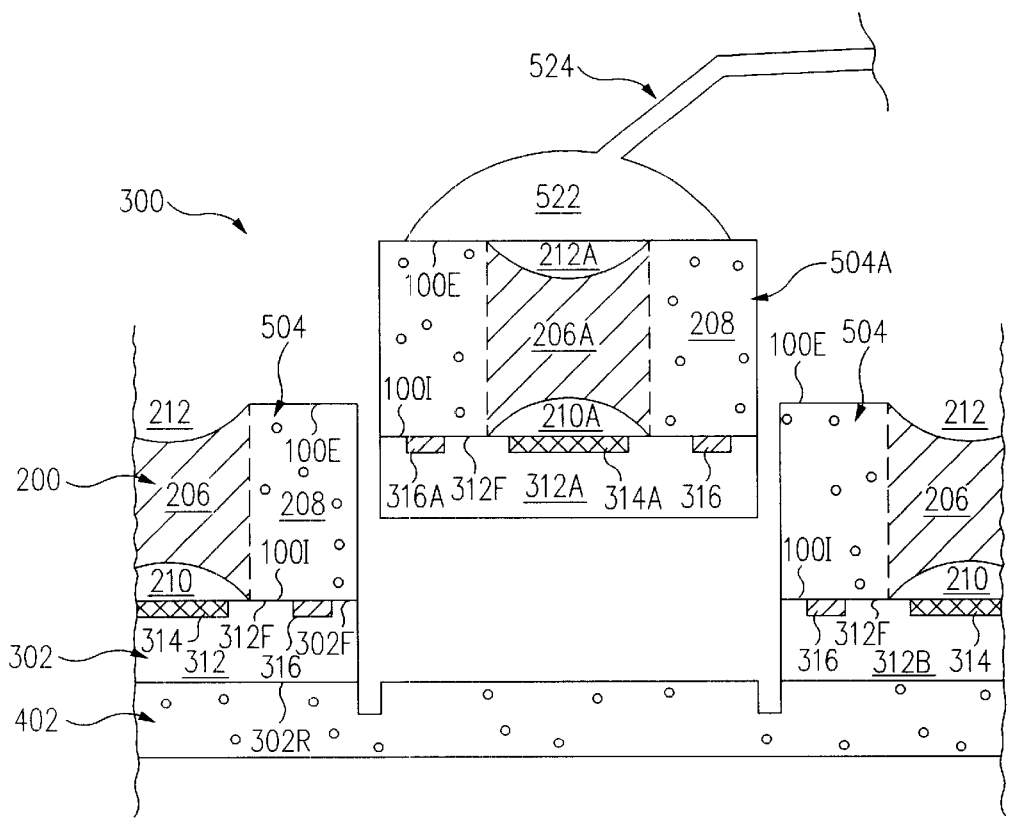
FIG. 5 is a cross-sectional view of the structure of FIG. 4 at a further stage during singulation processing in accordance with one embodiment of the present invention.

FIG. 5 is a cross-sectional view of structure 300 of FIG. 4 at a further stage during singulation processing in accordance with one embodiment of the present invention. As shown in FIG. 5, micromachine substrate 302 has been singulated into a plurality of individual micromachine chips 312. Further, protective layer 200 has been singulated into a plurality of individual caps 504. Each cap 504 includes a cavity 210 and an interior surface 100I. Active areas 314 of micromachine chips 312 are located within cavities 210. Further, interior surfaces 100I of caps 504 are mounted to front-side surfaces 312F of micromachine chips 312 around a periphery of active areas 314.

To illustrate, a first cap 504A of the plurality of caps 504 is mounted to micromachine chip 312A. Active area 314A of micromachine chip 312A is located within cavity 210A of cap 504A. Further, interior surface 100I of cap 504A is mounted to front-side surface 312F of micromachine chip 312A around a periphery of active area 314A. The other caps 504 are mounted to the other micromachine chips 312 in a similar manner so are not described further to avoid detracting from the principals of the invention.

A vacuum pickup head 522 of a pick and place machine 524 attaches to exterior surface 100E of cap 504A and removes micromachine chip 312A with cap 504A still attached from singulation support 402. Advantageously, active area 314A of micromachine chip 312A is protected by cap 504A. This allows micromachine chip 312A to be packaged for shipment without taking any further special precautions. Alternatively, micromachine chip 312A is further processed as is well known to those of skill in the art. The other micromachine chips 312 having caps 504 attached are similarly removed from singulation support 402 by pick and place machine 524.

In one embodiment, protective layer 200 is negative characteristic protective layer 200N of FIG. 2B. In accordance with this embodiment, caps 504 are mechanically removed from micromachine chips 312, e.g., with tweezers.

Figure 6:
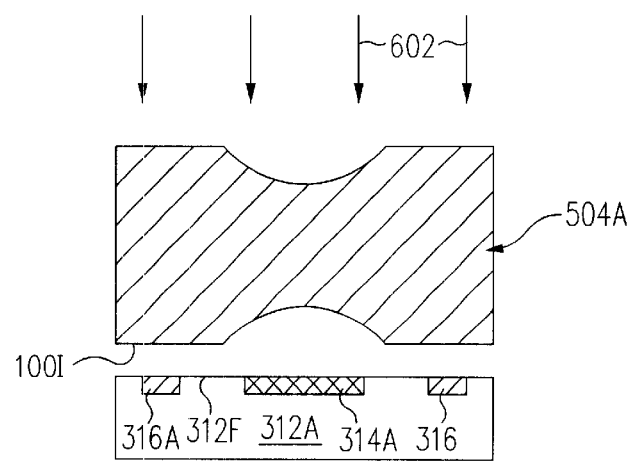
FIG. 6 is a cross-sectional view of the removal of a cap from a micromachine chip in accordance with one embodiment of the present invention.

In an alternative embodiment, protective layer 200 is positive characteristic protective layer 200P of FIG. 2A. FIG. 6 is a cross-sectional view of the removal of cap 504A from micromachine chip 312A in accordance with this embodiment. As shown in FIG. 6, cap 504A is irradiated with ultraviolet radiation 602 to fully polymerize cap 504A and to render interior surface 100I nonadhesive. Accordingly, cap 504A loses the adhesive mounting to micromachine chip 312A and is easily removed.

Figure 7:
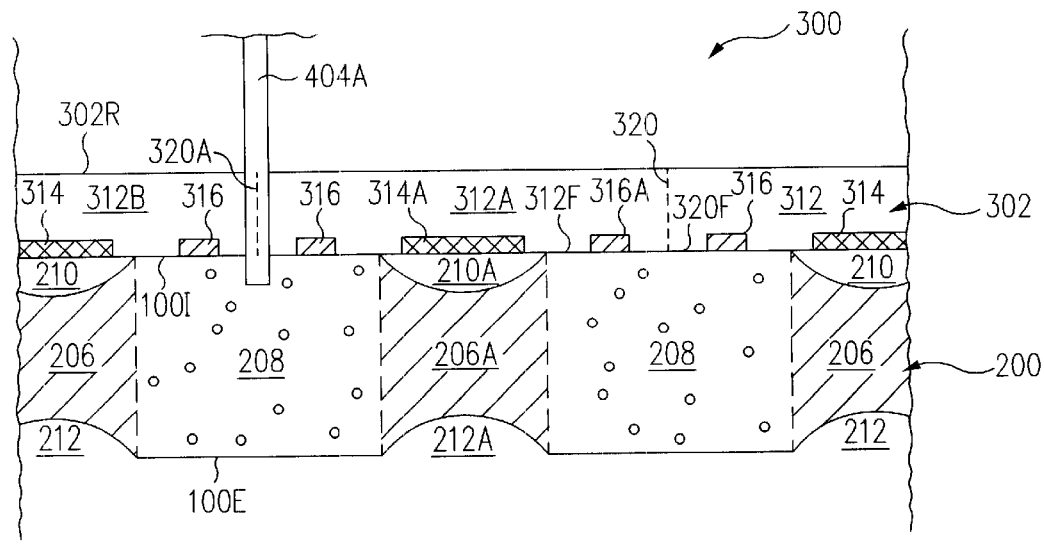
FIG. 7 is a cross-sectional view of the structure of FIG. 3 at a further stage during singulation processing in accordance with an alternative embodiment of the present invention.

FIG. 7 is a cross-sectional view of structure 300 of FIG. 3 at a further stage during singulation processing in accordance with an alternative embodiment of the present invention. In accordance with this embodiment, structure 300 is inverted from the view of FIG. 3 such that protective layer 200 supports micromachine substrate 302 during singulation. Micromachine substrate 302 is singulated by cutting micromachine substrate 302 from back-side surface 302R.

Saw 404A, e.g., a mechanical saw, laser saw or high-pressure water saw, is aligned to singulation street 320A. For example, saw 404A is aligned to singulation street 320A using alignment marks on back-side surface 302R of micromachine substrate 302 or on protective layer 200.

Micromachine substrate 302 is cut along singulation street 320A. More generally, micromachine substrate 302 is cut along singulation streets 320 thus singulating micromachine substrate 302 and separating micromachine chips 312.

Saw 404A cuts all the way through micromachine substrate 302 yet only scores protective layer 200. Accordingly, after singulation of micromachine substrate 302, protective layer 200 supports micromachine chips 312.

Figure 8:
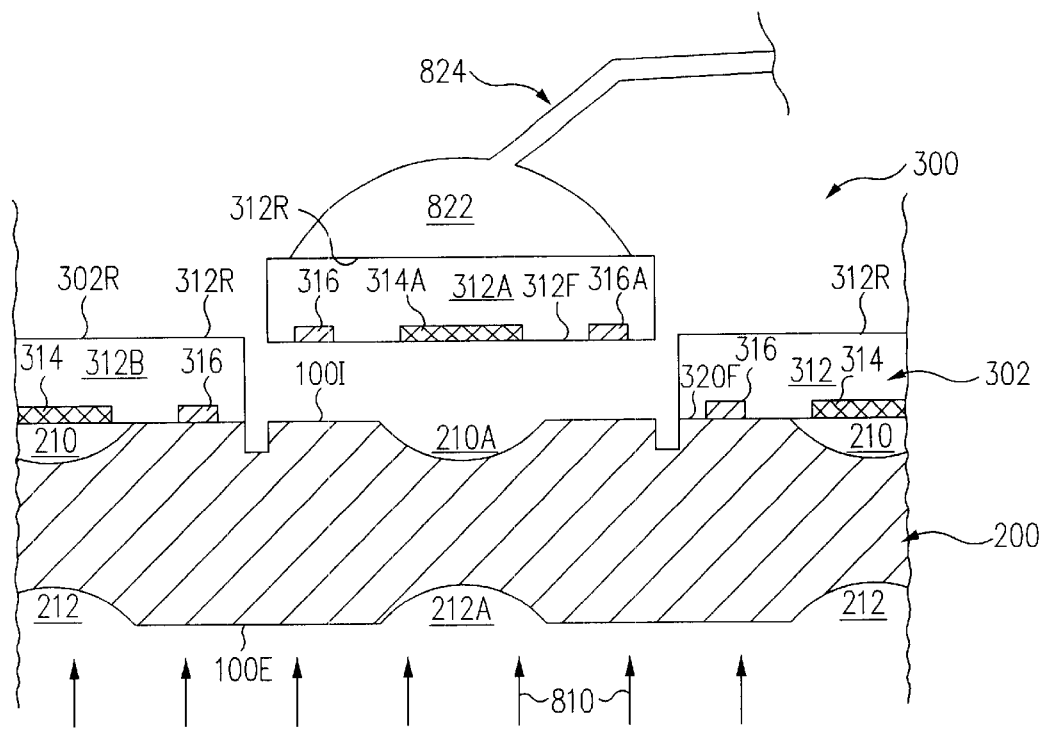
FIG. 8 is a cross-sectional view of the structure of FIG. 7 at a further stage during singulation processing in accordance with one embodiment of the present invention.

FIG. 8 is a cross-sectional view of structure 300 of FIG. 7 at a further stage during singulation processing in accordance with one embodiment of the present invention. A vacuum pickup head 822 of a pick and place machine 824 attaches to a back-side surface 312R of micromachine chip 312A. Pick and place machine 824 removes micromachine chip 312A from protective layer 200. Micromachine chip 312A is packaged for shipment or is further processed as is well known to those of skill in the art.

In one embodiment, protective layer 200 is positive characteristic protective layer 200P of FIG. 2A. In accordance with this embodiment, to facilitate removal of micromachine chips 312 from protective layer 200, protective layer 200 is irradiated with ultraviolet radiation 810 from exterior surface 100E. This polymerizes unpolymerized regions 208 (FIG. 7) and renders interior surface 100I nonadhesive. Accordingly, micromachine chips 312 lose the adhesive mounting to protective layer 200 facilitate removal of micromachine chips 312 by pick and place machine 824.

As set forth above, protective layer 200 protects active areas 314 of micromachine substrate 302 during singulation from front-side surface 302F (FIG. 4) or from back-side surface 302R (FIG. 7) of micromachine substrate 302. Advantageously, the prior art requirement of mechanically punching holes in a first layer, precisely aligning the holes over active areas on a front-side surface of a wafer, attaching the first layer to the front-side surface of the wafer, and attaching a second layer to the first layer to seal the holes is eliminated. Accordingly, processing of micromachine chips 312 in accordance with the present invention is less complex, less labor-intensive and thus less expensive than fabrication of micromachine chips in the prior art.

This application is related to Glenn et al., commonly assigned and co-filed U.S. patent application Ser. No. 09/811,184, entitled "METHOD OF PROTECTING A MICROMACHINE WITH A CAVITY IN A UV TAPE", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
   a substrate comprising an electronic component comprising an active area; and
   a protective layer coupled to a first surface of said substrate, said protective layer comprising a polymerized region above said active area, said polymerized region forming a cavity, wherein said protective layer further comprises an unpolymerized region having a greater width than said polymerized region.

2. The structure of claim 1 wherein a first surface of said protective layer is coupled to said first surface of said substrate and wherein said cavity is formed in said first surface of said protective layer.

3. The structure of claim 2 wherein said active area is located within said cavity.

4. The structure of claim 3 wherein said active area is protected by said protective layer.

5. The structure of claim 1 wherein said electronic component is a micromachine chip.

6. The structure of claim 1 wherein said active area is located within a cavity formed by said polymerized region.

7. The structure of claim 6 wherein said cavity is concave.

8. The structure of claim 1 wherein said unpolymerized region comprises an adhesive surface coupled to said first surface of said substrate.

9. The structure of claim 1 wherein said unpolymerized region becomes polymerized upon being irradiated with ultraviolet radiation.

10. The structure of claim 1 wherein said polymerized region becomes unpolymerized upon being irradiated with ultraviolet radiation.

11. A structure comprising:
    a substrate comprising an electronic component comprising an active area, wherein said electronic component is an image sensor chip; and
    a protective layer coupled to a first surface of said substrate, said protective layer comprising a polymerized region above said active area, said polymerized region forming a cavity.

12. A structure comprising:
    an electronic component comprising a first surface and an active area on said first surface; and
    a cap coupled to said first surface of said electronic component and protecting said active area, wherein said cap comprises a polymerized region above said active area, wherein said polymerized region forms a cavity, wherein said cap comprises a first surface mounted to said first surface of said electronic component around a periphery of said active area, and wherein said first surface of said cap is adhesive.

13. The structure of claim 12 wherein said active area is located within said cavity.

14. The structure of claim 12 wherein said active area comprises a micromachine.

15. A structure comprising:
    an electronic component comprising a first surface and an active area on said first surface; and
    a cap coupled to said first surface of said electronic component and protecting said active area, wherein said cap comprises a polymerized region above said active area, wherein said polymerized region forms a cavity, and wherein said polymerized region becomes unpolymerized upon being irradiated with ultraviolet radiation.

16. The structure of claim 15 wherein said cap comprises a first surface mounted to said first surface of said electronic component around a periphery of said active area.

17. A structure for protecting an active area of an electronic component comprising:
    an adhesive first surface;
    a polymerized region having a first width, wherein said polymerized region forms a cavity in said adhesive first surface; and
    an unpolymerized region having a second width greater than said first width.

18. The structure of claim 17 wherein said polymerized region becomes unpolymerized upon being irradiated with ultraviolet radiation.

19. The structure of claim 17 wherein said unpolymerized region becomes polymerized upon being irradiated with ultraviolet radiation.

20. A structure comprising:
    an electronic component comprising a first surface and an active area on said first surface; and
    means for protecting said active area coupled to said first surface of said electronic component, said means for protecting comprising a region sensitive to ultraviolet radiation, wherein said region sensitive to ultraviolet radiation forms a cavity, and wherein said means for protecting comprises a positive characteristic polymerizable material.

21. A structure comprising:
    an electronic component comprising a first surface and an active area on said first surface; and
    means for protecting said active area coupled to said first surface of said electronic component, said means for protecting comprising a region sensitive to ultraviolet radiation, wherein said region sensitive to ultraviolet radiation forms a cavity, and wherein said means for protecting comprises a negative characteristic polymerizable material.

* * * * *